United States Patent [19]

Stonestreet et al.

[11] Patent Number: 4,776,744
[45] Date of Patent: Oct. 11, 1988

[54] SYSTEMS AND METHODS FOR WAFER HANDLING IN SEMICONDUCTOR PROCESS EQUIPMENT

[75] Inventors: Paul Stonestreet, Cowfold; Clive Allum; Bert Webber, both of Crawley; Richard Cooke, West Worthing; Frederick J. L. Robinson, Crawley; Michael T. Wauk, II, Haywards Heath, all of England

[73] Assignee: Applied Materials, Inc., Santa Clara, Calif.

[21] Appl. No.: 774,209

[22] Filed: Sep. 9, 1985

[51] Int. Cl.⁴ .............................................. B65G 1/00
[52] U.S. Cl. ................................. 414/217; 414/417; 414/786; 269/254 R; 269/287
[58] Field of Search ............... 414/417, 217, 222, 225, 414/786; 269/254 R, 287, 903

[56] References Cited
U.S. PATENT DOCUMENTS
4,449,885  5/1984  Hertel et al. ................... 414/417 X Primary Examiner—Robert J. Spar
Assistant Examiner—Stuart J. Millman
Attorney, Agent, or Firm—Flehr, Hohbach, Test, Albritton & Herbert

[57] ABSTRACT

A system and methods for handling semiconductor wafers and dummy wafers in semiconductor process equipment such as an ion implanter. Tray assemblies are provided, each of which is adapted for releasably holding and automatically aligning a standard semiconductor wafer cassette next to a dedicated dummy-wafer cassette. The dummy wafers are used to complete a full load of wafers when there are insufficient wafers in the standard cassette. The trays are mounted on the paddles of a load lock carousel, which indexes the trays to an unloading/loading station. There, an indexer assembly picks up and indexes the tray so that the standard and dummy wafers can be selectively lifted by a vertical transport mechanism to a pivotal wafer chuck for transfer into the process equipment.

4 Claims, 6 Drawing Sheets

SYSTEMS AND METHODS FOR WAFER HANDLING IN SEMICONDUCTOR PROCESS EQUIPMENT

BACKGROUND OF THE INVENTION

This invention relates generally to systems and methods for handling semiconductor wafers in semiconductor process equipment and, more specifically, to systems and methods for conveying wafers in standard plastic wafer cassettes to a wafer transfer station, for receiving wafers into a vacuum load lock system and conveying the wafers to a wafer transfer station, and for batch handling of semiconductor wafers in wafer processing situations where full batch processing is required and dummy wafers may have to be used due to missing wafers in a plastic wafer cassette.

DISCUSSION OF BACKGROUND AND PRIOR ART

The manufacture of large scale integrated circuit (LSIC) chips has become one of the most important industries in the world over the last ten or fifteen years. This technology has produced the dramatic improvement in performance/cost of both mainframe and minicomputer systems and the microcomputer systems which are proliferating in the home computer and professional office computer field. LSIC technology has also made significant advances in performance and cost reduction in telecommunications and real time control systems for industrial processes and equpment. To understand the importance of this invention in the LSIC field, some background information on integrated circuit (IC) manufacture will be helpful.

USE OF ION IMPLANTATION IN SEMICONDUCTOR PROCESSING

Very great improvements in the scale of integration of semiconductor devices on IC chips and the speed of operation of such devices have been achieved over the past several years. These improvements have been made possible by a number of advances in IC manufacturing equipment as well as improvements in the materials and methods utilized in processing virgin semiconductor wafers into IC chips. The most dramatic advances in manufacturing equipment have been improved apparatus for lithography and etching and improved systems for implanting ions of conductivity modifying impurities into semiconductor wafers.

The density of integrated circuits and their speed of operation are dependent largely upon the accuracy and resolution of the lithography and etching systems used to form patterns of circuit elements in masking layers on the semiconductor wafer. However, density and speed are also dependent upon tight control of the profile of doped regions in the wafer, i.e., regions to which substantial concentrations of conductivity modifying impurities have been added. Tight control of wafer doping can best be achieved using ion implantation techniques and equipment.

The semiconductor processing industry is highly oriented toward batch processing of semiconductor wafers. In the infancy of the industry, almost all processing of wafers involved hand manipulation of the wafers. Wafers are almost universally carried from one item of process equipment to another in plastic wafer cassettes which carry twenty five wafers. Manual handling of wafers to remove them from the plastic wafer cassette and place them onto a wafer mounting surface in an item of processing equipment or into a special cassette for loading into a wafer processing system inherently involves risk of wafer contamination and breakage. As the industry has progressed, the demand for automated handling of wafers during loading of process equipment has also grown.

This invention is particularly directed to meeting performance challenges involved automated wafer handling and loading of high current ion implantation systems. However, this is just one case of the application of the invention to automation of wafer handling. High current ion implantation machines, in the parlance of the current state of the art, are considered to be machines which generate useful boron ion beam currents of 2-3 milliamperes (mA) and about 10-12 mA of arsenic ion beam current. The expense of high current ion implanters demands that effective automation of wafer handling be provided, but systems currently on the market do not adequately meet the advancing needs of the industry.

To achieve even greater manufacturing efficiency, the semiconductor manufacturing industry is looking to develop even higher beam current ion implantation systems to increase wafer throughput for high dose implants. A copending and commonly assigned U.S. patent application of Derek Aitken entitled APPARATUS AND METHODS FOR ION IMPLANTATION, U.S. patent application Ser. No. 641,027, filed Aug. 15, 1984, now U.S. Pat. No. 4,578,589, issued Mar. 25, 1986, discloses ion beam line technology capable of generating useful ion beam currents several times greater in magnitude than current commercial state of the art technology. More specifically, boron ion beam currents in excess of 10 mA and arsenic ion beam currents in excess of 30 mA are achievable utilizing the novel ion optics technology and ion beam line component technology disclosed in the Aitken application. This technology will herein be referred to as the Aitken very high current beam technology. Ion beam currents will at these levels result in a new generation of ion implantation apparatus which will dramatically improve wafer throughput especially for high dose implants. Effective automation of wafer handling is even more important in high throughput machines and implanters which are oriented toward performance capabilities which make production of advanced semiconductor devices more feasible on a large manufacturing scale. The desired features in a wafer handling system for a high throughput ion implanter system are the following:

(1) Batch loading of wafers onto the wafer scanning system in the vacuum environment of the main wafer process chamber without breaking the vacuum between batch loading and unloading.

(2) Ability to use the standard plastic wafer cassette in the wafer handling system so that standard cassette to special cassette transfer can be avoided.

(3) Provision of dummy wafers to substitute for missing wafers in the cassette since the scan wheel must be fully loaded.

(4) Multiple cassette handling in a separate load lock vacuum chamber for implantation of multicassette batches without breaking vacuum so that critical parts in the wafer process chamber and post-acceleration tube are not exposed to air between batches.

(5) Simplicity of wafer conveyance mechanisms with high accuracy of positioning at the wafer transfer station.

(6) Low particulate generation.

(7) Minimized clean room intrusion for operation and maintenance.

The prior art systems currently in use in the ion implantation field do not achieve all of these desirable results. Currently available systems generally require that the vacuum of the wafer process chamber be broken each time the new batch of wafers is loaded. This drastically affects throughput due to the requirement for pumpdown of a large chamber. This problem increases with growing wafer sizes and resultant increases in internal volume of the process chamber and slower pumpdown times.

Breaking vacuum also risks particulate intrusion. Introduction of air into the process chamber between batches causes air to be adsorbed on parts that will be exposed to the ion beam and thus increases contamination. The presence of air in the chamber interferes with placement and removal of wafer on heat sinks in the scan assembly on an automated basis. It is difficult to remove the air behind a wafer as it is placed on a heat sink. It is also difficult to remove a wafer from a heat sink at atmosphere due to the vacuum behind the wafer left over from implant processing under vacuum conditions.

Most of the current wafer handling systems have a large intrusion to the clean room and some require that portions of the system maintenance be performed in the clean room itself. Some of the systems use standard wafer cassettes but do not satisfy many of the other desired performance features.

It is the principal object of this invention to provide improved systems and methods for wafer handling in automated semiconductor process equipment.

It is another object of this invention to provide a wafer handling system which permits usage of standard plastic wafer cassettes and avoids any wafer registration problems during wafer transfer due to a warped cassette.

It is another object of this invention to provide a wafer handling system which has greatly improved facility for handling dummy wafers required for full batch processing.

It is another object of this invention to provide a wafer handling system which permits processing of multicassette wafer batches with minimized pumping cycles and simplicity of wafer cassette loading into the system.

It is another object of this invention to provide a wafer handling system which minimizes clean room intrusion.

One aspect of this invention features a wafer handling tray comprising a frame adapted to removably receive a standard plastic wafer cassette which carries up to a total of twenty five wafers of a prearranged diameter, and a dummy wafer cassette mounted to one end of the frame means and adapted to carry a plurality of semiconductor wafers of the same diameter as wafers carried in the standard cassette. One or more of the wafers carried in the dummy wafer cassette may be withdrawn at a wafer processing station which requires a full complement of twenty five wafers to be processed when a corresponding number of actual wafers are missing from the standard plastic wafer cassette.

Preferably the frame further comprises a fixturing surface arrangement on at least three interior edges of the frame with each of the fixturing surfaces being adapted to contact three exterior bottom portions of a plastic wafer cassette. A spring biasing arrangement positioned relative to a fourth edge of the frame urges the plastic wafer cassette toward a fixturing surface opposite the spring as the cassette is inserted so that the fixturing surfaces square up the bottom portion of the plastic wafer cassette to place individual wafer slots in the cassette tray in an accurately registered position on the tray.

The above feature of the invention advantageously permits plastic wafer cassette units to be used even in a wafer transfer arrangement which requires very accurate positioning of the individual wafer slots in the cassette. This positioning accuracy is particularly required in systems which access the wafer from underneath the cassette through apertures in the bottom wall of each wafer slot.

Another object of this invention features a wafer handling system for carrying a batch of semiconductor wafers to a wafer transfer station associated with wafer processing equipment for batch processing a standard complement of twenty five wafers. A wafer handling tray carries a standard plastic wafer cassette having a plurality of wafer carrying slots with bottom access apertures communicating with each of the slots. A transport arrangement conveys the wafer handling tray to a wafer transfer station and indexes the wafer handling tray to a plurality of wafer transfer positions corresponding to the bottom access apertures in the plastic wafer cassette. A wafer transfer system at the wafer transfer station transfers a wafer from each of the wafer slots to a wafer receiving surface associated with the wafer processing equipment. The wafer handling tray has the features described above for trueing the cassette and handling dummy wafers.

Another aspect of this invention features a wafer handling system for carrying a plurality of batches of semiconductor wafers to a wafer transfer station associated with wafer processing equipment which processes the wafers in a vacuum environment. The system includes a load lock enclosure having a front door adapted to open to permit insertion of wafer cassette trays and to close and seal for evacuation of the enclosure. A wall of the enclosure has a water transfer port communicating with the wafer processing equipment and a vacuum valve is mounted to seal the transfer port when not in use. The wafer transfer port is positioned at a wafer transfer location within the load lock enclosure. A plurality of wafer handling trays carry a plurality of standard plastic wafer cassettes. A rotating carousel including a plurality of radially arrayed paddles carries the plurality of wafer handling trays and transports the trays from a loading position adjacent the front door to a tray transfer position defined at a remote location within the load lock enclosure. A tray transfer arrangement at the tray transfer position removes a tray from one of the paddles, transports the tray to the wafer transfer station and indexes the tray and wafer cassette thereon to sequential wafer transfer positions associated with each wafer carrying slot in the plastic wafer cassette.

This feature of the invention provides for multiple cassette handling within a load lock to enable processing of large batches of wafers between pumpdowns of the load lock chamber. Combined with standard plastic wafer cassette usage, this feature provides fast loading of cassette trays into the system and facilitates total automation of the wafer handling thereafter. Preferably very accurate wafer tray positioning is achieved by providing on each of the tray carrying paddles of the carousel a tray positioning jigging arrangement and on each of the wafer handling trays a tray position fixturing arrangement cooperating with the jigging arrangement. It is also preferable that the tray transfer arrangement include a carriage assembly having a second tray position jigging arrangement thereon and that each of the wafer handling trays include a second tray position fixturing arrangement cooperating with the second jigging arrangement to position the tray in a precisely registered position on the carriage assembly.

This accurate fixturing and jigging of the wafer tray makes it possible to do accurate positioning for wafer pickup and transfer through the bottom apertures of the plastic wafer cassette.

The use of a load lock chamber with a vacuum valve isolation from the vacuum chamber in which the wafers are processed provides the advantage of eliminating the heed to isolate the post-acceleration system from the wafer process chamber during loading of wafers on the scan wheel therein. Air contamination of parts struck by the ion beam is eliminated. Loading and unloading of wafers can be done in vacuum to avoid problems of air entrapment between the wafer and heat sink during loading of the wafers and vacuum to air pressure differential from back to front of the wafers during wafer unloading.

Another aspect of this invention features a method for transferring a full standard batch of semiconductor wafers to a wafer processing apparatus which requires a full batch. The method includes providing a wafer handling tray with a dummy wafer cassette mounted thereon and loading a standard wafer cassette carrying fewer than a full batch of wafers on said wafer handling tray. Thereafter the dummy wafer cassette is filled with at least enough dummy wafers to make up for the number of wafers missing from said standard wafer cassette. The method continues with the steps of conveying said wafer handling tray to a wafer transfer station, removing from said standard wafer cassette all of said wafers therein one at a time for transfer to said wafer processing apparatus, and then removing from said dummy wafer cassette the number of dummy wafers therein corresponding to the number missing from said standard cassette one at a time for transfer to said wafer processing equipment. This method provides the advantage of facilitating use of dummy wafers without taking the time to go to a separate dummy wafer cassette, bring it to the transfer station and then transfer the wafers to the wafer processing equipment. It also saves time on the unloading step since the dummy wafers can be placed back in the local dummy cassette.

This invention also features a method for transferring semiconductor wafers to a wafer transfer station whereat an elevating mechanism removes and replaces wafers from a cassette by accessing wafers from underneath the cassette. The method includes providing a wafer handling tray having a cassette truing jigging frame thereon and loading into said jigging frame of said wafer handling tray a standard plastic cassette at least partly filled with wafers to square up the bottom portion of said cassette and place access apertures in said bottom portion in aligned positions relative to said frame. This enables this assembly to be conveyed to a wafer transfer station with accurate registration for wafer transfer. The advantages of avoiding use of special cassettes are described above.

Other objects, features and advantages of this invention, together with a more complete understanding of those discussed above will be obtained from a consideration of the following detailed description in conjunction with the accompanying drawings.

DETAILED DESCRIPTION OF EMBODIMENTS OF THE INVENTION

Figure 1:
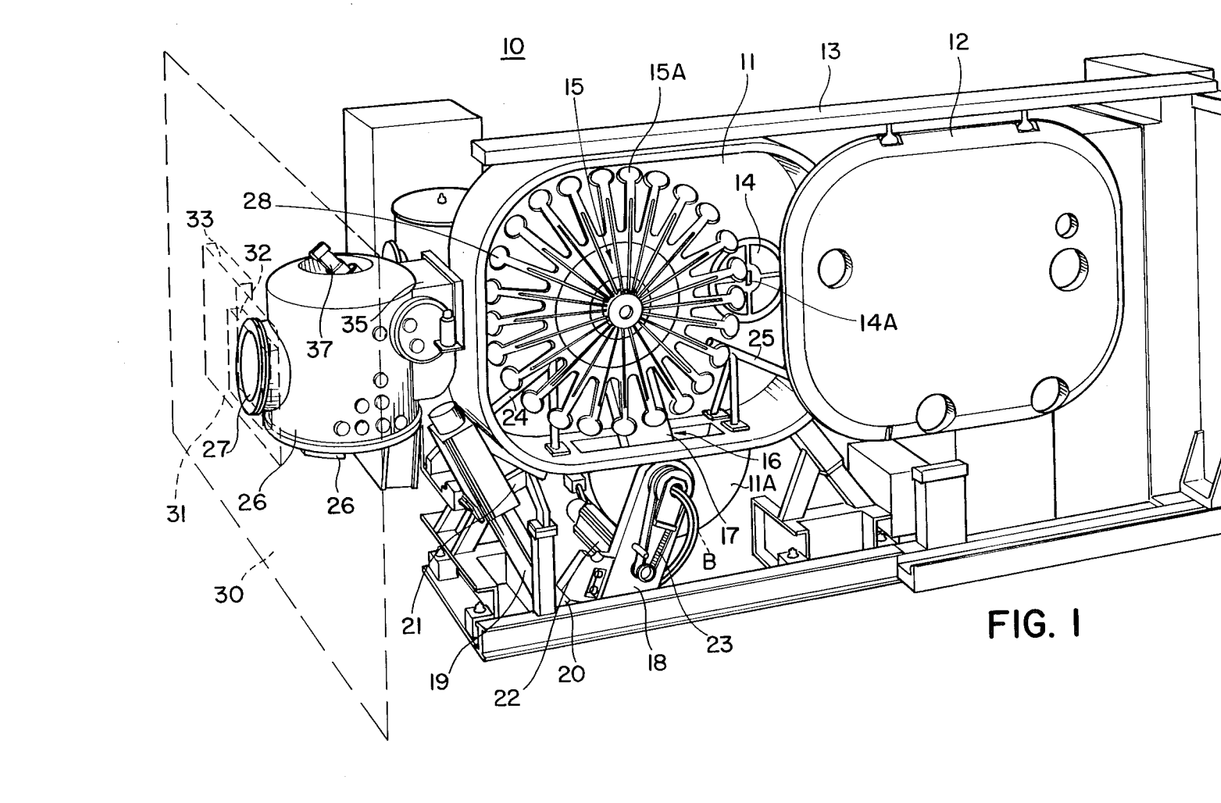
FIG. 1 is a perspective view of an ion implantation system inclorporating a wafer handling system in accordance with this invention.

FIG. 1 depicts an ion implantation system 10 which includes a wafer process chamber 11 having a sliding front door 12 carried on an overhead track 13 and having sealed view ports therein. When moved into position over the chamber 11, the door 12 completes a vacuum chamber in which wafer processing for ion implantation is performed. A separate vacuum chamber 26 serves as a load lock chamber and has a wafer handling system in the interior thereof as described below. A pass-through chamber 35 communicates between the wafer processor chamber 11 and the load lock chamber 26. A wafer pass-through port between the load lock chamber and the pass-through chamber (shown on FIG. 2) is controllably sealed and opened with a vacuum valve arrangement 37. When closed, the vacuum valve maintains vacuum conditions in the processor chamber even though vacuum is broken in the load lock chamber to insert wafers therein.

The entry port 27 of the load lock chamber 26 extends through an opening 31 in a wall 30 in a clean room. A sealing door arrangement 32 and a door opening and closing mechanism 33 provide access to the entry port 27 from the clean room side. This is the only intrusion of the ion implanter system in the clean room, except for a control system (not shown).

Vacuum pumping apparatus (not shown) communicates with the interior of vacuum chamber 11 to pump down the chamber and provide the evacuated atmosphere required for effective ion implanation. A separate vacuum pump system (not shown) communicates with the load lock chamber 26 to provide separate control of vacuum environment in that chamber. An ion beam generating and analyzing system (not shown) communicates an ion beam to the vacuum chamber through a post-acceleration system 14 which extends through the back of the vacuum chamber 11. The ion beam generating and analyzing system is preferably the type disclosed in the above-referred Aitken application.

A scan wheel assembly 15 is mounted within the vacuum chamber 11. The scan wheel assembly 15 includes twenty-five wafer mounting paddles 15A arranged in a circular array around a central hub. Scan wheel assembly 15 is mounted for high velocity rotation about its central axis and for rotational precession about an axis at the bottom of the scan arm assembly 17 which extends into a well 11A at the bottom of the vacuum chamber.

A mounting and drive arrangement 16 mounts the scan wheel assembly 15 in the vacuum chamber 11 and includes various mounting arrangements and drive arrangements for accomplishing the dual rotational and precessional scan of the scan wheel assembly. The main elements of the mounting and drive arrangement 16 are scan arm 17 which is directly coupled to drive arm 18, which in turn is driven by a motor and lead screw drive arrangement 19. A ball type coupling 20 couples the drive arm 18 to the translating carriage (not shown) of lead screw drive arrangement 19. Drive arrangement 19 is mounted for rotation to a bracket 21. A motor 22 mounted to the drive arm 18 drives a belt drive transmission arrangement 23 which includes a belt drive arrangement (not shown) mounted within hollow scan arm housing 17 to provide the drive for rapid rotation of the scan wheel assembly 15. These drive mechanisms also operate to position the wafer paddles 15A at wafer handoff location 28 during wafer loading and unloading. Further details of the wafer scanning system are disclosed in allowed, commonly assigned, copending Robinson et al. U.S. patent application Ser. No. 774,192, filed Sept. 9, 1985, now U.S. Pat. No. 4,733,091, issued Mar. 22, 1988 and entitled SYSTEM AND METHOD FOR ION IMPLANTATION OF SEMICONDUCTOR WAFERS.

Figure 2:
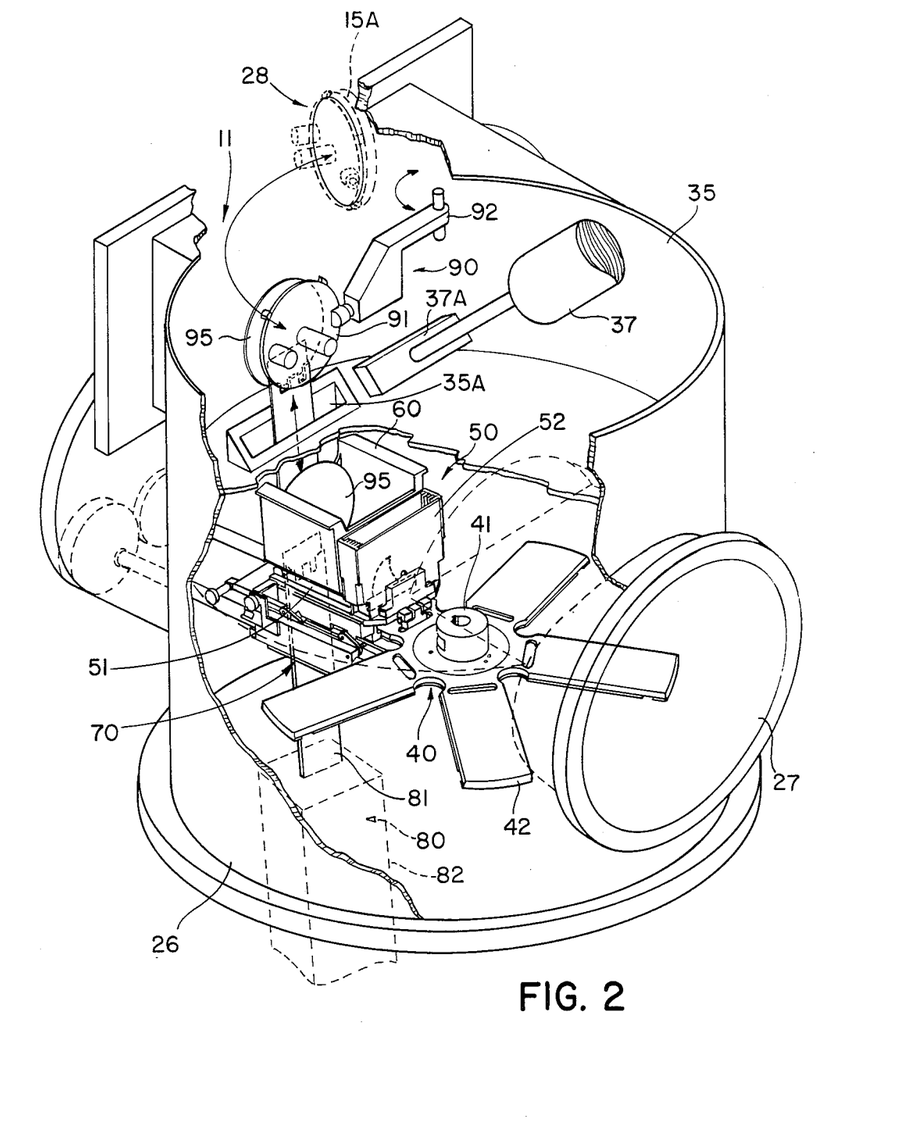
FIG. 2 a cutaway perspective view of a wafer handling and loading system in accordance with this invention.

FIG. 2 illustrates the main subsystems and components of a wafer handling and transfer system in accordance with this invention as especially adapted for use in an ion implantation system as shown in FIG. 1. Load lock chamber 26 and load lock port 27 define a lower chamber housing a wafer carousel subassembly 40 which cooperates with wafer handling trays 50 carrying standard plastic wafer cassettes 60 to handle a total of up to one hundred and twenty-five semiconductor wafers 95. Wafer carousel 40 includes a central hub arrangement 41 with five wafer tray paddles 42 radially extending therefrom. A drive arrangement in the form of a standard manifold indexer with ten preset index positions (not shown) rotates the wafer tray paddles 42 around the axis of the hub 41 to carry individual wafer trays 50 from a preset tray load position adjacent the entry port 27 to a preset tray transfer position opposite the port 27. This is the position of the wafer tray 50 shown in FIG. 2. In normal operation, each of the paddles 42 will have a wafer handling tray 50 mounted thereon. However, the wafer carousel assembly 40 can carry any number of wafer handling trays 50 from one to five depending on the batch processing requirements of the system user.

Indexer subassembly 70 is positioned at the tray transfer position of carousel 40 and functions to lift the wafer handling tray 50 off of the carousel paddle 42 located at the tray transfer station and thereafter to controllably index the wafer handling tray 50 with a plastic wafer cassette 60 thereon to sequential wafer transfer positions. At each position one of the individual wafer compartments in the plastic wafer cassette 60 is located precisely at a wafer transfer position defined by wafer elevating blade 81.

Figures 4, 5, 6:
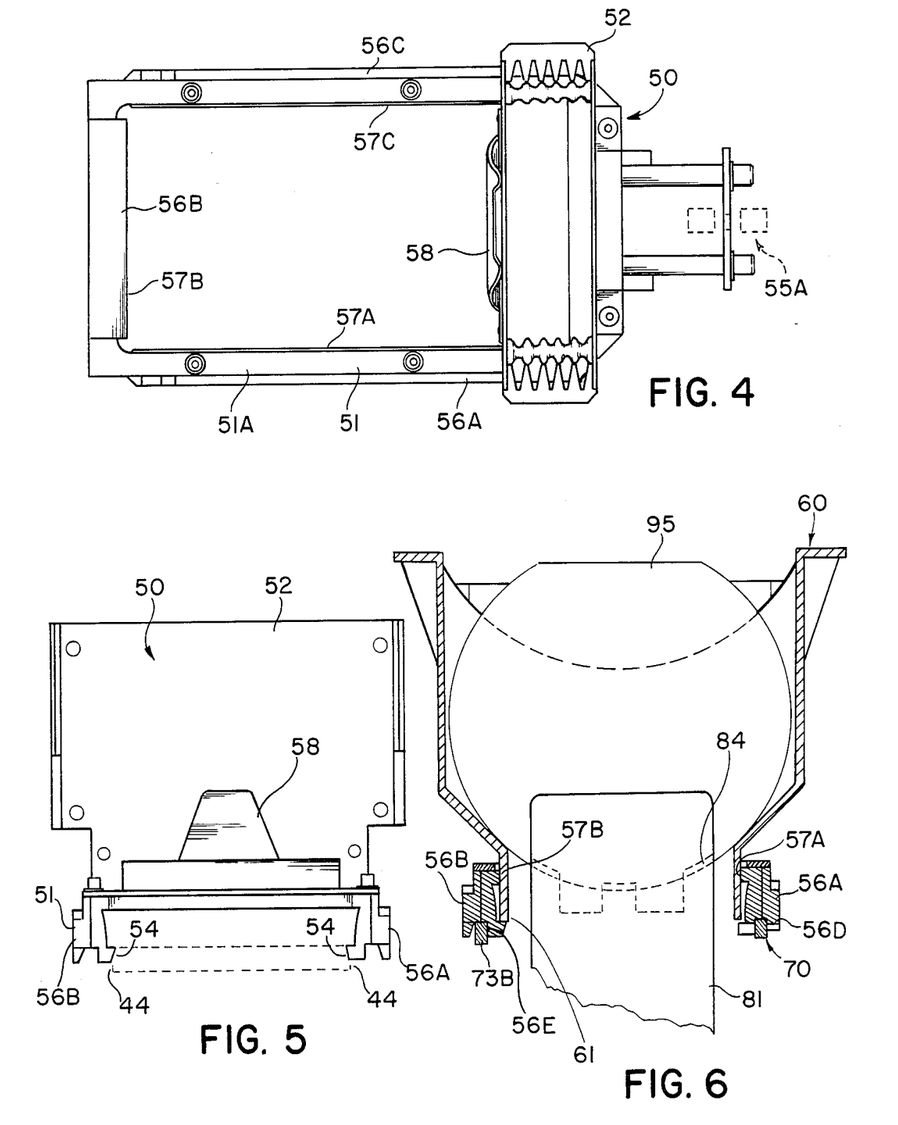
FIG. 4 is a top plan view of a wafer handling tray in accordance with this invention.
FIG. 5 is a back elevational view of a wafer handling tray in accordance with this invention.
FIG. 6 is a section view throough a wafer handling tray in accordance with this invention.

As shown in FIG. 6, wafer cassette 60 carries wafers in individual slots and the bottom of each slot has an aperture therethrough with the wafer being supported at bottom surfaces on an angled solid surface of the cassette. The aperture in the bottom of each wafer slot in cassette 60 admits a blade 81 of a wafer transfer system 80. The leading top edge of the blade holds the back of the wafer to preclude vibration of the wafer in the blade slot as it is accelerated toward the wafer hand off location. Blade 81 is driven in a substantially vertical motion by an appropriate blade reciprocating drive arrangement 82 mounted beneath the load lock chamber 26. Vertical drive of the blade 81 causes a wafer 95 to be pushed out of its carrying slot in cassette 60 through a wafer transfer port 35A which communicates between the load lock chamber 26 and an upper chamber 35 which is in vacuum communication with wafer processor chamber 11 as also shown in FIG. 1.

Blade 81 carries individual wafers 95 to a wafer handoff station within chamber 35. At the wafer handoff station a wafer gripper assembly 91 is positioned. Gripper assembly 90 is generally of the type disclosed in commonly assigned, copending Jacobs, et al. U.S. patent application Ser. No. 591,439 entitled FINGER CHUCK AND METHOD FOR HANDLING ARTICLES filed Mar. 20, 1984, now abandoned. Wafer gripper 91 grasps wafer 95 in an edge finger arrangement and thereafter the lifting blade 81 retracts back through the cassette 60 and tray 50. At this point, indexer 70 indexes to the next wafer and drive arm 92 of the wafer handoff assembly 90 rotates the wafer gripper 91 and the wafer 95 to scan arm handoff station 28.

As disclosed in the above-mentioned copending Robinson, et al. application each of the heat sink paddles 15A includes an outer wafer edge restraint and an edge clamp arrangement to temporarily grip a semiconductor wafer placed against the wafer mounting surface of a heat sink insert. After the clamp arrangement on the heat sink paddle 15A has secured the wafer 95 on the heat sink paddle, the wafer gripper 91 releases the wafer and swings back to the blade handoff station.

Wafer tray carousel 40 is designed such that the individual tray paddles 42 are canted down at a slight angle from the horizontal so that the wafers 95 carried in the wafer cassettes 60 are uniformly leaning against the back surface of the individual wafer slots in the cassette. Lifting blade 81 is disposed at a similar angle to controllably push wafer 95 to the blade handoff station. As necessary, gripper 91 may be mouted for some controllable rotation to the drive arm 92 to control the angular orientation of gripper 91 and wafer 95 relative to appropriate positioning of the wafer 95 relative to the heat sink 15A at the gripper to heat sink transfer station.

Between handoffs of individual wafers 95 to heat sink paddles 15A, the scan wheel assembly 15 shown in FIG. 1 rotates to position a new vacant heat sink paddle at the scan arm handoff station. Gripper 91 goes back and receives the next wafer positioned thereat by blade 81. The steps for unloading semiconductor wafers from heat syncs 15A is essentially the reverse of the above-described loading process. Utilizing appropriately designed systems for wafer transfer out of the cassette 60, a full twenty-five wafer loading operation or unloading operation can be carried out in approximately two to three minutes. The overall cycle time to unload the wheel into one cassette and reload from a new cassette on the carousel is about seven or eight minutes.

If tray 60 contains less than twenty-five wafers, due to a small wafer batch or prior breakage of one or more wafers in the twenty-five wafer batch, dummy wafers will be transferred out of dummy cassette 52 carried on the wafer handling tray 50 to make up a full load of twenty-five wafers on the ion implanter scan wheel. Dummy cassette 52 shown in FIG. 2 carries up to five dummy wafers which are immediately accessible when wafer handling tray 50 is at the tray transfer station. It would be unusual to have fewer than twenty wafers in cassette 60. Therefore, under normal conditions, the five dummy wafers in dummy cassette 52 will be sufficient to make up any missing wafers in the standard plastic cassette 60. If missing wafers are detected, the indexer 70 simply indexes the wafer handling tray 50 to place one or more of the dummy wafer slots in dummy cassette 52 at the wafer transfer position for blade 81 to lift dummy wafers one at a time to hand off to the heat sink on the scan wheel assembly. The wafer handling and transfer system functions under computer control to remember the presence of dummy wafers on known heat sink paddles so that they will be returned to the dummy cassette and not to the wafer cassette 60 upon unloading of the scan wheel after implantation of the wafers.

A vacuum valve arrangement 37 is provided for closing the wafer transfer port 35A to isolate the transfer chamber 35 and wafer processor chamber 11 from the load lock chamber 26. This is done prior to opening the door covering the entry port 27 for changing wafer trays 50 within load lock chamber 26. A separate vacuum pump arrangement (not shown) communicates with the load lock chamber 26 for separate rapid pumpdown of that small chamber after a fresh batch of wafer trays 50 has been loaded on the carousel paddles 42 and the door covering port 27 is closed and sealed.

Referring now to FIGS. 3–6, the structure and arrangement of the wafer carousel 40 and the individual wafer handling trays 50 will be described. Each of the wafer tray paddles 42 has a wafer tray jigging arrangement 43 mounted thereon to cooperate with a positioning fixture arrangement 53 on the front of the frame 51 of the tray. Angled jigging surfaces 44 on each paddle 42 cooperate with angled fixturing surfaces 54 on frame 51, as best seen in FIG. 5, to precisely locate each individual wafer handling tray 50 in the other coordinate direction on paddle 42. It will be appreciated that this is one example of a precision fixturing and jigging arrangement which could be provided between the paddle and the tray. This is a particularly effective one since the inverted v-grooves in the fixture on the frame 51 can be readily positioned on the cylindrical bar of the jig 43 while placing the wafer tray 50 on the paddle 42. It will be appreciated that this precise positioning is required for the indexing mechanism to accurately lift the tray 50 off of the paddle at the tray transfer station. This operation will be described below.

The wafer handling tray 50 has dummy cassette 52 mounted on top of the frame 51 near the front end thereof. A position flag 55 is mounted in a cantilevered fashion off of a bracket on the front of frame 51 to cooperate with an optical positioning sensing arrangement 55A to signal whether the wafer tray 50 is on or off the paddle. Position sensor arrangement 55A will typically be mounted on brackets which fasten to the ceiling of the load lock chamber 26 above the rotating hub 41. This bracket arrangement can be provided in any convenient manner which doesn't interfere with the movement of the carousel.

Figure 3:
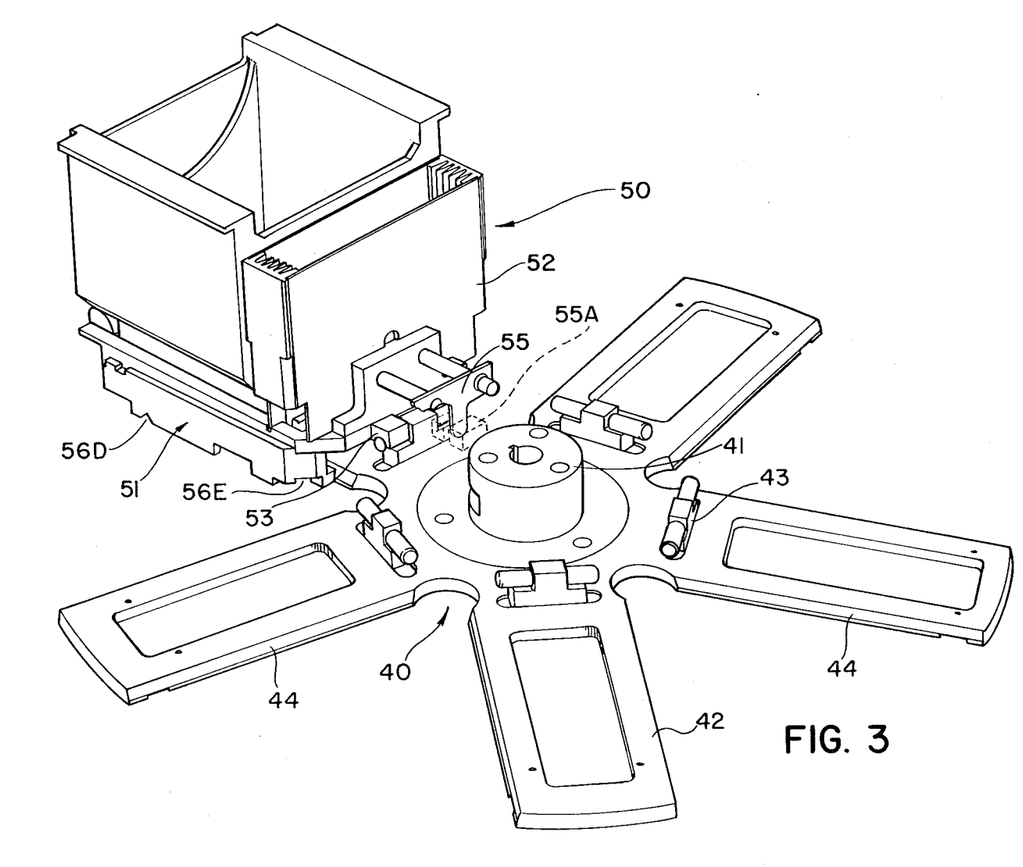
FIG. 3 is a perspective view of a wafer handling tray and rotating carousel arrangement in accordance with this invention.

The drive of the carousel arrangement 40 is preferably accomplished by a shaft and motor drive arrangement with the shaft extending through the floor of the load lock chamber 26 through a ferrofluidic vacuum to air rotating seal arrangement. Motor drive and bearing components are positioned outside the vacuum chamber to prevent them being a source of particulate contamination to wafers in the load lock chamber.

As shown in FIGS. 4–6, frame 51 includes a metal frame portion 51A which is basically rectangular and carries thereon molded fixturing pieces 56A, 56B and 56C made of TEFLON plastic coating or similar material.

The inner vertical surfaces 57A, 57B and 57C serve as jigging surfaces for three sides of a wafer cassette to true the bottom walls of the cassette to a precise rectangular configuration as the wafer cassette is pushed into the open center region of frame 51. A leaf spring arrangement 58 cooperates with a front exterior wall of the plastic wafer cassette to provide a tight interference fit of the cassette against the jigging surfaces of the frame by urging the cassette toward the back jigging surface 57B. This arrangement advantageously permits plastic wafer cassettes which are notorious for becoming warped to be utilized with the wafer handling tray of this invention. Because the jigging surfaces 57A, 57B and 57C true up the bottom portion of the cassette, this enables the apertures 61 in the bottom wall of each wafer slot in the cassette to be precisely registered for admission of the wafer elevator blade 81 to raise and lower the wafer 95. Without this jigging arrangement a warped cassette would not admit the wafer elevator blade 81 cleanly so that the blade 81 might actually push the cassette 60 out of the tray.

As shown in FIG. 6 the blade 81 is admitted through the aperture 61 and has a broad vertically extending back surface 83 which touches the back surface of the wafer as the wafer leans against the top surface of projection 83 and rests in a groove 84 on a front surface of the blade 81. The broad leading edge 83 of the wafer elevator blade 81 supports the back of the wafer and prevents vibration of the wafer 95 during raising and lowering thereof to the handoff station as shown in FIG. 2. For purposes of rapid wafer handling, it is desirable to rapidly accelerate the elevator blade 81 after picking up the wafer. Vibration of the wafer relative to the blade is undesirable during this acceleration because it can produce flaking of particulates from the edge of the wafer which, in turn, can cause wafer contamination problems.

Figure 7:
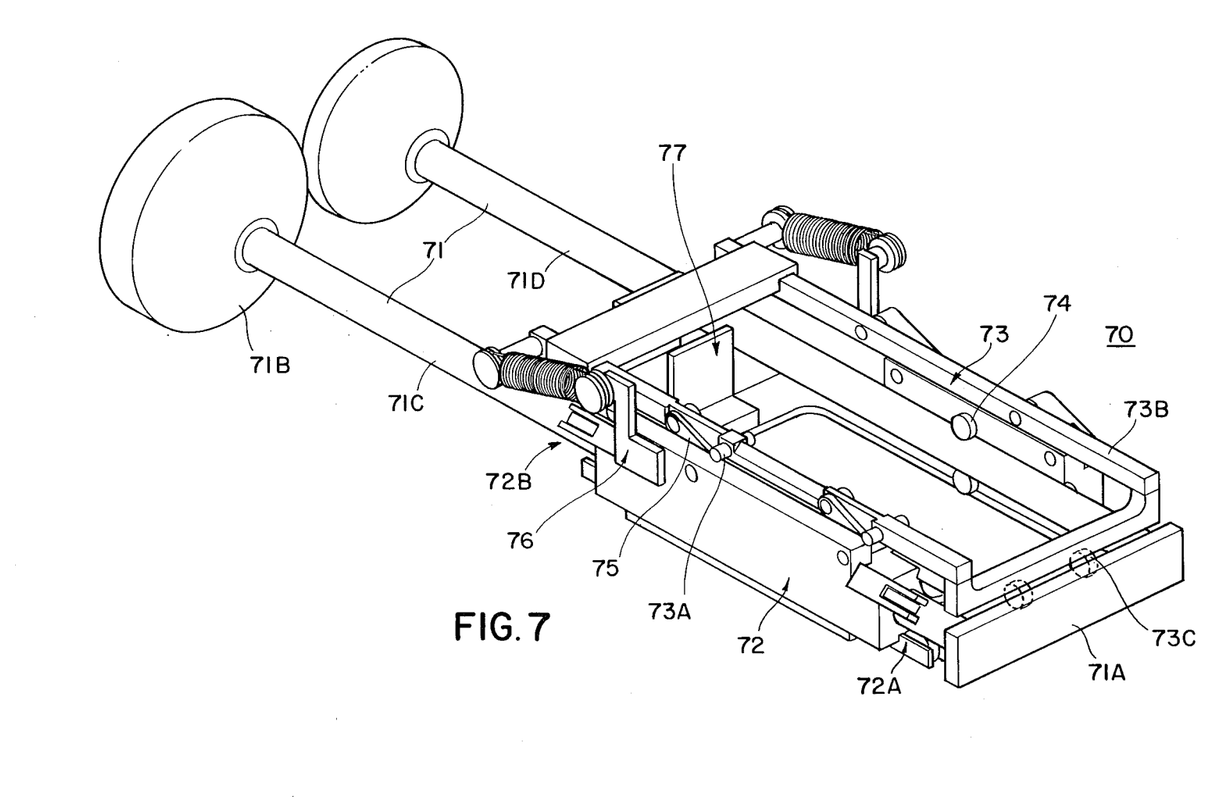
FIG. 7 is perspective view of a tray lifter and indexer assembly in accordance with this invention.
Figure 8:
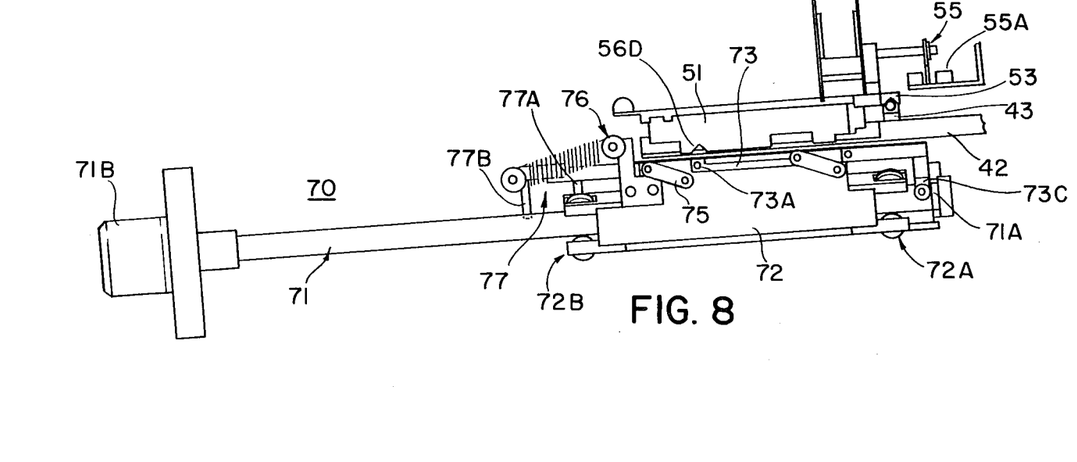
FIGS. 8 and 9 are side elevational views of a wafer handling tray and a tray lifter and indexer assembly in accordance with this invention.
Figure 9:
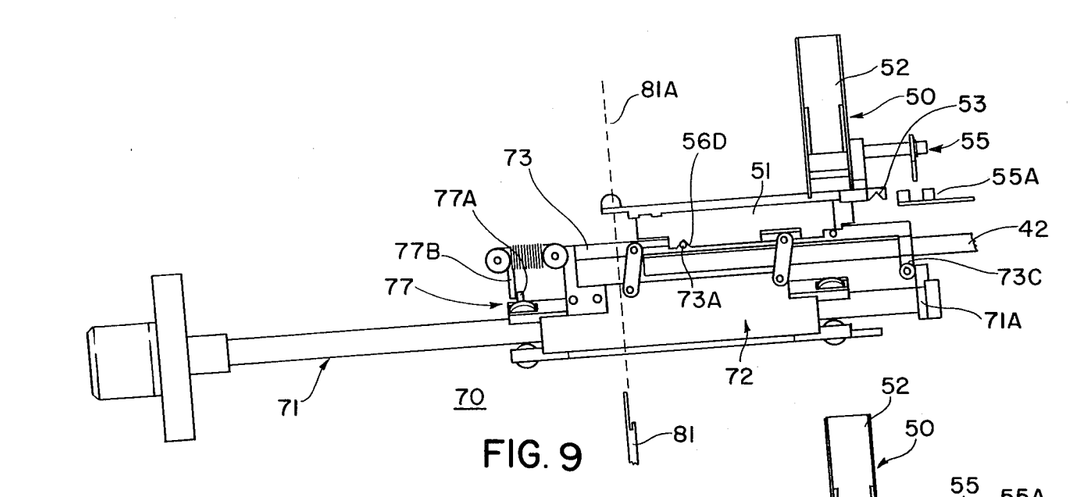

FIG. 6 also shows the jigging and fixturing of wafer handling tray 50 in general, and frame 51 in particular on jigging surfaces of the indexer assembly 70. Indexer arrangement 70 and its structure and operation are depicted in FIGS. 7–9. Track and drive arrangement 71 includes tracks 71C and 71D on which the lower carriage assembly 72 is mounted utilizing tripod wheel arrangements 72A and 72B on one track and idler wheel arrangement 74 on the other track. Within the interior of the guide tube 71C is a magnetic drive arrangement including a group of permanent magnets which cooperate with corresponding permanent magnets mounted in carriage 72 to drive the lower carriage assembly 72 back and forth along the tracks 71C and 71D. A motor 71B drives a lead screw arrangement within the tube 71C to translate the position of the permanent magnets inside and thereby to accurately position the lower carriage assembly 72.

Upper carriage assembly 73 is basically a rectangular frame which is mounted to the lower carriage assembly in a hinged fashion using hinge arrangements 75. A bracket and spring arrangement 76 is coupled between the lower carriage assembly 72 and the upper carriage assembly 73 and includes a tension spring which tends to bias the upper carriage assembly 73 in its upwardly hinged position shown in FIG. 9. The topmost position of upper carriage assembly 73 is determined by a stop arrangement 77 having a position defining stop 77A mounted on lower carriage 72 and a stop bar 77B mounted on upper carriage frame 73.

A jigging pin 73A cooperates with a fixturing v-groove 56D on the frame 51 of the wafer handling tray 50 when tray 50 is raised off of carousel paddle 42 by lifting and indexing assembly 70. Frame elements 73B on upper carriage frame 73 cooperate with fixturing grooves 56E in frame elements 56A and 56B of wafer handling tray 50 to precisely locate tray 51 on upper carriage frame 73 when it is picked up from the carousel paddle 42. This precise positioning on the index is required for accurate registration of the tray and cassette at the wafer transfer station associated with blade 81.

A stop 71A mounted at the end tracking drive arrangement 71 cooperates with a roller guide 73C on the front of upper carriage frame 73 to guide the upward movement of upper carriage frame 73 while picking up the frame 51 of the wafer handling tray 50. When carousel paddles 42 carrying wafer handling trays 50 thereon are moving and indexing into position, the lifting and indexing assembly 70 is in the position shown in FIG. 8. Lower carriage assembly 72 has been driven all the way tothe right end of its track. As roller guide 73 encounters the stop 71A upper carriage frame 73 can no longer move forward with lower carriage assembly 72. Consequently upper carriage frame 73 is lowered on the hinges 75 against the spring pressure of the spring coupling arrangement 76 until it reaches the position shown in FIG. 8. At this point the paddles 42 are free to rotate over the upper carriage frame 73 to position a tray 50 in a tray transfer position.

To pick up the tray 50 from paddle 42, drive 71B pulls lower carriage 72 backward. This causes upper carriage frame 73 to raise straight upward on hinges 75 until the carriage frame stop 77B encounters the lower carriage stop 77A as shown in FIG. 9. Further movement backward of the lower carriage assembly 72 carries the upper carriage frame in the upper position and the wafer handling tray 50 along with it in a sequentially indexed fashion to bring wafer slot locations on a plastic wafer cassette in the frame 51 to a wafer transfer point 81A defined by the plane of the wafer elevator blade 81. Any suitable position tracking arrangement may be mounted on the lower carriage frame 72 to precisely position lower carriage assembly 72 at sequentially indexed positions which are accurate enough to permit the blade 81 to enter a cassette 60 as shown in FIG. 6 to pick up a wafer 95 and carry it out of the cassette. Preferably an optical position securing arrangement which physically tracks movement of the lower carriage assembly will be employed.

It should be apparent from the above description of this invention and various features thereof that this invention achieves the desired performance features of automated wafer handling and loading in an ion implantation system. It should be understood that all of the drive arrangements of the system of this invention will be controlled by a central control computer so that all of the motions of the subsystems are under computer control for automation purposes. Such computer control functions are readily implemented using standard off-the-shelf types of drive control arrangements and interfaces to the programmed digital computer. These standard detector and motor drive arrangements under computer control need not be described in this application.

The system of this invention provides for batch loading of wafers onto the wafer scanning system in the vacuum environment of an ion implanter wafer process chamber without breaking the vacuum in the large chamber. When it is necessary to reload wafer handling trays into the load lock chamber 26 the vacuum valve arrangement 37 is operated to isolate the wafer process chamber when the load lock chamber 26 is vented to atmosphere. This avoid any transfer of particulates to the wafer process chamber and avoids the pumpdown cycle which would otherwise be required to return that chamber to low pressure conditions for ion implantation. Air contamination of parts in the wafer processor chamber is avoided.

The wafer handling tray 50 permits standard plastic wafer cassettes to be used in the wafer handling system. No cassette to cassette transfer of wafers is required since the jigging feature of the frame on the wafer handling tray 50 trues up the plastic cassette for accuracy which must be accurately registered at a wafer transfer location.

The wafer handling tray 50 uniquely solves the dummy wafer problem by providing a dummy wafer cassette 52 right on the wafer handling tray. This greatly facilitates loading and unloading of wafer batches which are missing wafers since the wafer handling system does not need to go to a separate dummy wafer cassette in order to obtain the dummy wafers for loading onto the scan wheel.

The carousel arrangement of this invention provides for multiple cassette handling in the separate load lock chamber so that a large number of wafers in multi-cassette batches can be handled without taking the time or risking the contamination involved in breaking the vacuum at the interface between clean room and the wafer handling station.

The wafer tray handling mechanisms of this invention are all simple and straightforward electromechanical systems which make it easy to use optoelectronic position tracking elements to accurately position the major components. Jigging and fixturing arrangements are cooperatively arranged so that accurate positioning is achieved at all times in the handling of the wafer trays 50.

Sources of particulates are substantially entirely eliminated from the wafer handling system of this invention since all motors and bearing surfaces are located outside the vacuum enclosures and wafer handling during the scan wheel loading process is performed under vacuum conditions. Clean room intrusion is as minimal as it is possible to be with only the load lock door present in the clean room.

It will thus be appreciated that the system of this invention enables automated wafer handling to be implemented with favorable impact on wafer throughput of an ion implantation system while maintaining good wafer handling practices to avoid any adverse impact on wafer process yield.

It will be apparent to persons of skill in the art that numerous modifications of the specific embodiments of features of this invention described above could be made without departing from the scope of the invention. For example, the wafer handling tray 50 with its unique dummy cassette feature and plastic cassette trueing jigging arrangement could be utilized on other types of wafer conveying arrangements. Thus it should be understood that the above description is given by way of example only and modifications could be made without departing from the scope of the invention as claimed in the following claims.

What is claimed is:

1. In a wafer handling system for carrying a batch of semiconductor wafers to a wafer transfer station associated with wafer processing equipment for batch processing a standard complement of wafers, a wafer handling tray for carrying a standard plastic wafer cassette having a plurality of wafer carrying slots with bottom access apertures communicating with each of said slots; transport means for conveying said wafer handling tray to a wafer transfer station and for indexing said wafer handling tray to a plurality of accurate wafer transfer positions with corresponding bottom access apertures in said plastic wafer cassette located at a predefined wafer transfer position at said wafer transfer station; and wafer transfer means at said wafer transfer station for transferring a wafer from each of said wafer slots to a wafer receiving surface associated with said wafer processing equipment, said wafer handling tray comprising frame means adapted to removably receive a standard plastic wafer cassette adapted to carry up to a standard batch number of semiconductor wafers of a prearranged diameter, and a dummy wafer cassette mounted to one end of said frame and adapted to carry a plurality of semiconductor wafers of the same diameter as wafers carried in said standard cassette in a plurality of wafer tray slots having bottom access apertures, whereby one or more of said wafers carried in said dummy wafer cassette may be withdrawn at said wafer transfer station to substitute for any wafers missing in slots in said standard plastic wafer cassette;

said water handling system being adapted for carrying a plurality of batches of semiconductor wafers to said wafer transfer station associated with equipment for processing said wafers in a vacuum chamber environment, and further comprising a load lock enclosure having a front door adapted to open to permit insertion of wafer cassette trays and to close and seal for evacuation of said enclosure; said wafer transfer station being located in said load lock enclosure; wall means defining a wafer transfer port between said load lock enclosure and said wafer processing equipment, said wafer transfer port being positioned at a wafer transfer location defined at said wafer transfer station; valve means selectably positionable over said port to isolate said vacuum chamber from said load lock enclosure; a plurality of said wafer handling trays for carrying a plurality of standard plastic wafer cassettes; said transport means comprising a rotating carousel including a plurality of radially arrayed paddles for carrying said plurality of wafer handling trays and transporting said trays from a loading position adjacent said front door to a tray transfer position defined at a remote location within said load lock enclosure; and tray transfer means at said tray transfer position defined at a remote location within said load lock enclosure for removing said tray from one of said paddles, for transporting said tray to said wafer transfer station and for indexing said tray and wafer cassette thereon to sequentially position said wafer carrying slots in said plastic wafer cassette at said wafer transfer position.

2. The system of claim 1,
wherein said frame means further comprises four interior edges having a fixturing surface means on each of at least three of said interior edges of said frame means adapted to contact three exterior bottom portions of a plastic wafer cassette, and spring biasing means positioned relative to a fourth edge of said frame means for urging said plastic wafer cassette toward the fixturing surface means opposite thereto as said cassette is inserted in said frame means so that said fixturing surface means squares up the bottom portion of said plastic wafer cassette to place individual wafer slots in said cassette tray in an accurately registered position on said tray.

3. The system of claim 2, wherein each of said tray carrying paddles of said carousel includes a tray positioning jigging means and each of said wafer handling trays includes tray positioning fixturing means cooperating with said jigging means on one of said paddles to mount said tray thereon in a precisely positioned manner; said tray transfer means includes carriage means having a a second tray position jigging means thereon and each of said wafer handling trays includes a second tray position fixturing means cooperating with said second jigging means to position said tray in a precisely registered position on said carriage means.

4. In a method for transferring a full standard batch of semiconductor wafers to a wafer processing apparatus which requires a full batch, the steps of:
providing a wafer handling tray with a dummy wafer cassette mounted thereon;
loading a standard wafer cassette carrying fewer than a full batch of wafers on said wafer handling tray;
filling said dummy wafer cassette with at least enough dummy wafers to make up for the number of wafers missing from said standard wafer cassette;
conveying said wafer handling tray to a wafer transfer station;
removing from said standard wafer cassette all of said wafers therein one at a time for transfer to said wafer processing apparatus; and removing from said dummy wafer cassette the number of dummy wafers therein corresponding to the number missing from said standard cassette one at a time for transfer to said wafer processing equipment.

* * * * *

UNITED STATES PATENT AND TRADEMARK OFFICE
CERTIFICATE OF CORRECTION

PATENT NO. : 4,776,744
DATED : October 11, 1988
INVENTOR(S) : PAUL STONESTREET ET AL It is certified that error appears in the above—identified patent and that said Letters Patent is hereby corrected as shown below:

IN THE SPECIFICATION

In Col. 12, line 32, after "cassette for accuracy", insert --of wafer transfer out of the cassette through bottom apertures--.

IN THE CLAIMS

In Claim 1, Col. 13, line 38, after "said frame", insert --means--.

Signed and Sealed this

Fourteenth Day of March, 1989

Attest:

DONALD J. QUIGG

*Attesting Officer*  *Commissioner of Patents and Trademarks*